United States Patent [19]

Cherney

[11] Patent Number: 5,575,860
[45] Date of Patent: Nov. 19, 1996

[54] FIBER OPTIC POWER-GENERATION SYSTEM

[76] Inventor: Matthew Cherney, One Park La., Mount Vernon, N.Y. 10552

[21] Appl. No.: 374,308

[22] Filed: Jan. 18, 1995

Related U.S. Application Data

[63] Continuation-in-part of Ser. No. 289,285, Aug. 11, 1994, Pat. No. 5,501,743.

[51] Int. Cl.$^6$ .................. H01L 31/045; H01L 31/052; H01L 31/058
[52] U.S. Cl. .................. 136/245; 136/246; 136/248
[58] Field of Search .................. 136/245, 246, 136/248

[56] References Cited

U.S. PATENT DOCUMENTS

| | | | |
|---|---|---|---|
| 4,068,121 | 1/1978 | Bringhurst et al. | 250/227.28 |
| 4,140,142 | 2/1979 | Dormidontov et al. | 136/246 |
| 4,153,475 | 5/1979 | Hider et al. | 136/246 |
| 4,242,147 | 12/1980 | DeToia | 136/253 |
| 4,529,830 | 7/1985 | Daniel | 136/246 |
| 5,089,055 | 2/1992 | Nakamura | 136/248 |

FOREIGN PATENT DOCUMENTS

| | | | |
|---|---|---|---|
| 61-189673 | 8/1986 | Japan | 136/246 |
| 4-111475 | 4/1992 | Japan | 136/246 |

OTHER PUBLICATIONS

J. I. Davis, "Solar Cell R & D", *Space/Aeronautics*, Apr. 1959, pp. 44–46.

Primary Examiner—Aaron Weisstuch
Attorney, Agent, or Firm—Herbert Dubno

[57] ABSTRACT

A fiber optical solar power generating system provides a tower outside a structure to be supplied with solar energy and on which a multiplicity of collectors is provided. An optical fiber trunk carries the collected optical energy to the structure in which a photovoltaic and/or a light/heat transducing stack can be provided and to which light is distributed from the optical fiber trunk so that the transducers need not occupy large areas of the property.

10 Claims, 10 Drawing Sheets

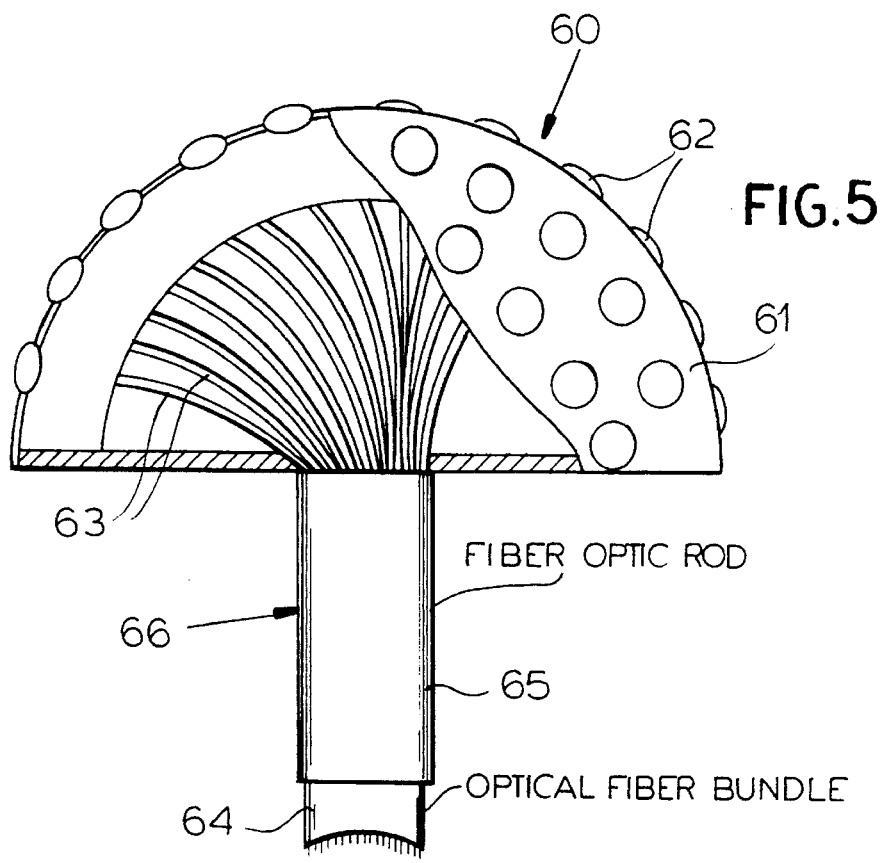
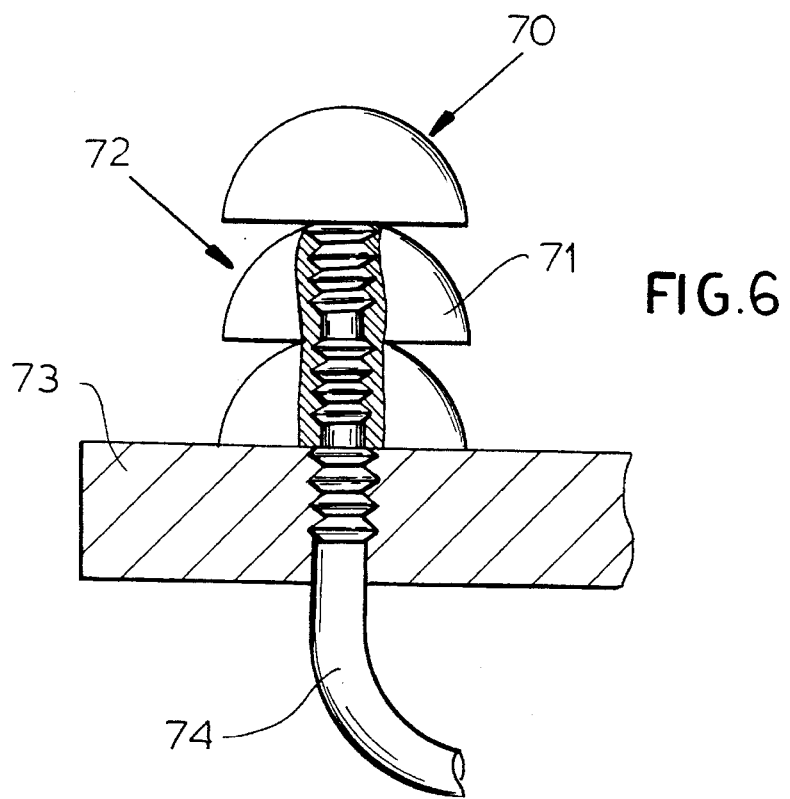

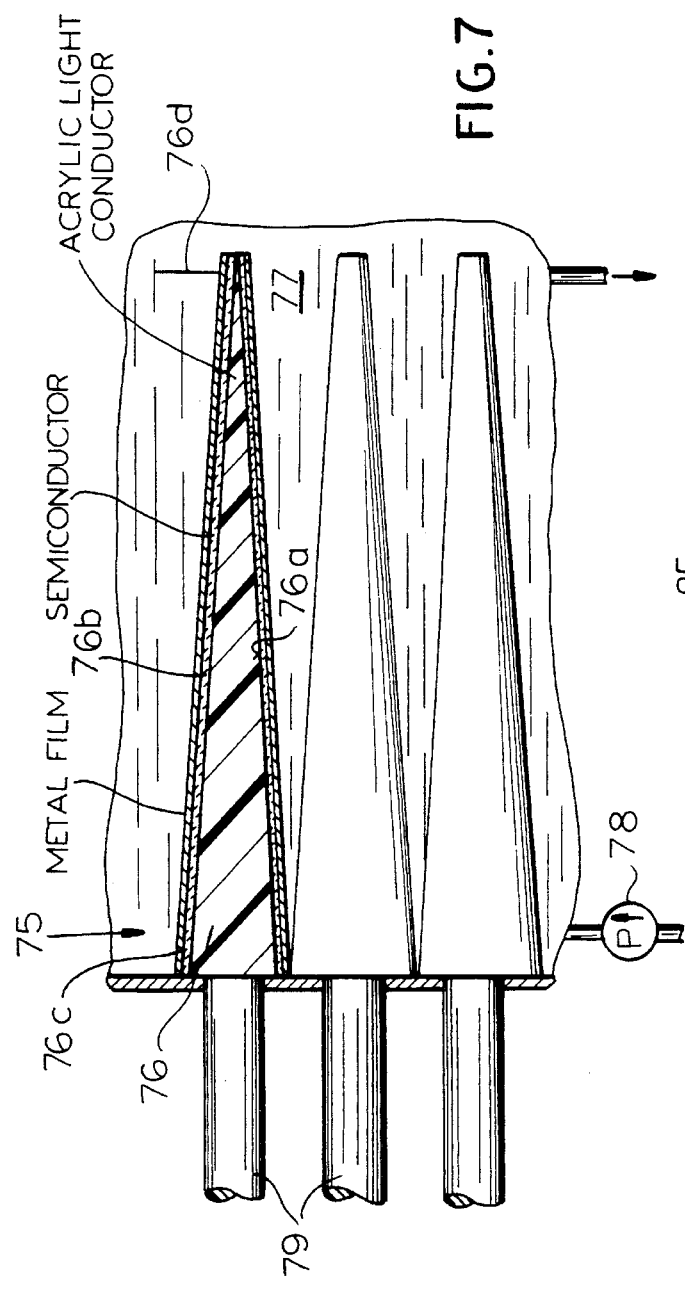
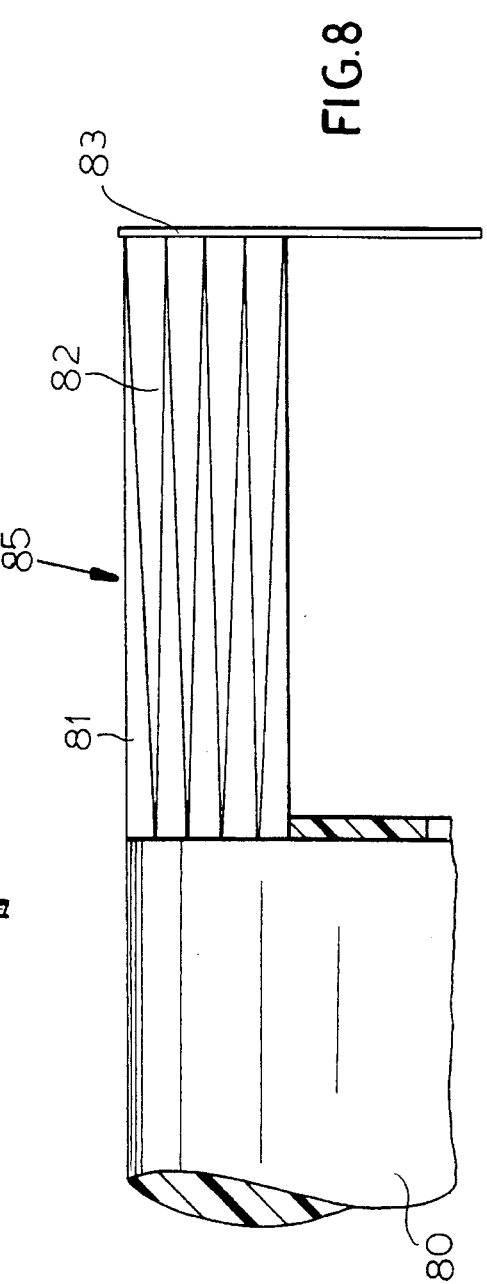

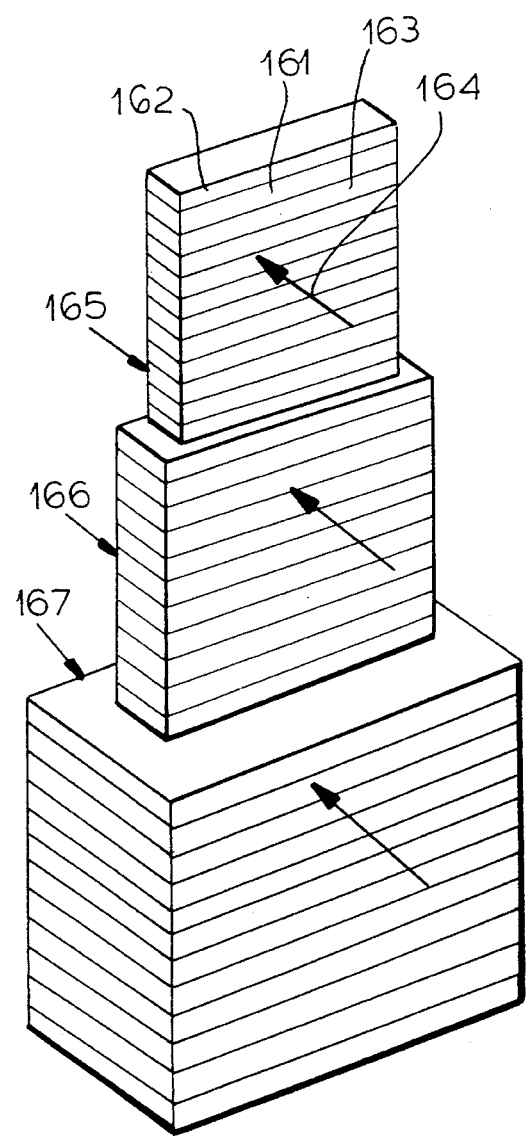
FIG.16
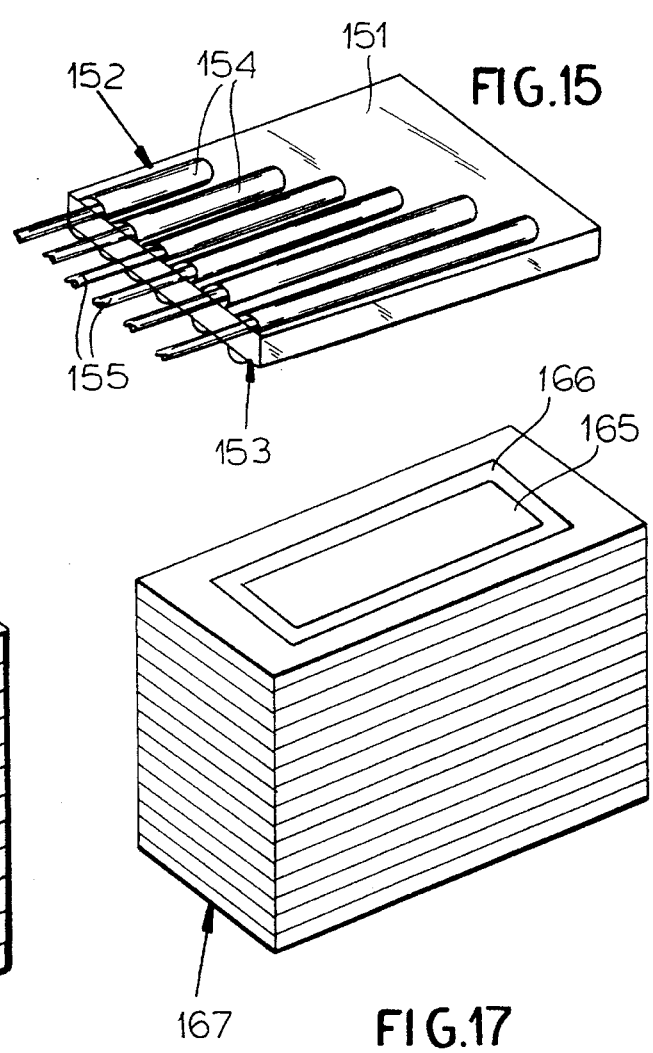
FIG.15
FIG.17

FIBER OPTIC POWER-GENERATION SYSTEM

CROSS REFERENCE TO RELATED APPLICATION

This application is a continuation-in-part of Ser. No. 08/289,285 filed Aug. 11, 1994, now U.S. Pat. No. 5,501,743.

FIELD OF THE INVENTION

The present invention relates to a fiber optic power-generating system and more particularly to an improved alternative energy source for structures utilizing optical fiber energy transmission.

BACKGROUND OF THE INVENTION

Increasing concern with fossil fuel as an energy source and concern with the safety of nuclear power has led to interest in the development of alternative energy sources such as solar power.

One of the major problems with solar power is the large area required for photovoltaic converters and even thermal solar energy converters when these must be directly positioned in the path of the solar radiation.

Furthermore, efforts to overcome this problem by the use of light concentrators or the like have not always proved to be effective. Reference may be had, for example, to U.S. Pat. No. 5,195,503 which discloses a relatively complex system intended to maximize the solar collection of heat from the sun with automatic tracking of the path of the sun.

Efforts have also been made to increase the energy output by passing a compressed gas through a solar collector (U.S. Pat. No. 4,942,736) or to provide tower systems which convey a vapor to a high point at which the vapor is condensed to a liquid and the falling liquid will drive a turbine (see U.S. Pat. No. 4,757,687). Other solar collectors of interest are described in U.S. Pat. Nos. 4,117,682, 4,236,937, 4,676,068, 4,558,551, 4,392,008, 4,219,729, 4,720,170 and 3,996,918, These systems do not solve the main problems discussed above with respect to the large areas required, the complexity of the systems, and the ability to install an effective solar energy system in, for example, a residence or similar structure.

OBJECTS OF THE INVENTION

It is, therefore, the principal object of the present invention to provide an improved solar energy collection and utilization system whereby drawbacks of earlier systems are avoided, the spacial requirements are greatly reduced and the portion of the apparatus which must be contained in the structure to be supplied with the energy is extremely compact.

Another object of the invention is to provide a low-cost high-efficiency system which is not limited by the need to cover large areas of the property with solar collectors or photovoltaic sheets and which nevertheless can generate useable electrical energy and heat at high efficiency.

SUMMARY OF THE INVENTION

I have discovered that these objects are readily attainable, utilizing either photovoltaic (semiconductor) plates or photothermal transducers, by providing the transducers in stacks with the light energy being transmitted to them by distributor plates forming part of the stack and juxtaposed with the photovoltaic or photothermal plates, the light energy being delivered to the distributors by optical fibers.

Preferably the light is collected by an external tower structure supplied with a multiplicity of collectors, especially lenses or lens systems from which the optical energy is delivered to the building via an optical fiber trunk which terminates at one or both of the stacks described.

More particularly, a fiber optic power-generating system can comprise:

a tower positioned outside a structure to be supplied with power;

a multiplicity of solar-light collectors on the tower over at least part of a height of the tower and around a periphery thereof;

respective optical fibers assigned to the collectors and transmitting light therefrom, the optical fibers being formed into an optical fiber trunk extending from the tower into the structure; and within the structure a stack of energy transducing plates each receiving at least one optical fiber from the trunk and provided with means for distributing light delivered by an optical fiber over the respective plate for producing energy utilized at least in part within the structure.

The invention also is a fiber optic system which comprises:

a stack of photovoltaic plates;

respective light distributors juxtaposed with each of the plates, the light distributors being sandwiched between pairs of photovoltaic plates of the stack; and respective light-delivering optical fibers connected to each of the light distributors for supplying light thereto.

It will be apparent that the stacking arrangement of the photovoltaic panels allows for a high panel surface area and therefore high electrical productivity in a small volume.

Since the stack is contained in the structure or building, the photovoltaic panels are not exposed to weather or physical stress and therefore can be fabricated at lower cost. The fiber optic main cable can be branched to distribute the light to the mirror lined panel stacks and can receive the light from relatively inexpensive sources like mirrors or lenses. The fact that such mirrors or lenses can be distributed, e.g. on the tower or at each collector can eliminate potential problems with overheating. When built to scale, the fiberoptic cables may be as wide as (and similar to) polyacrylate curtain rods. The stacks may be moved closer to the collectors so that the fiberoptic distance is minimal, with metal wire covering the remaining distance to the main structure.

According to a feature of the invention, the plates can be electrically connected in series and tied to a storage system, e.g. one or more batteries, which, in turn, supply an inverter for producing alternating current for the building or to a capacitance-regulation system. The means for distributing the light can be brush plates of optical fiber bristles or light-conductive plates (e.g. of a polyacrylate) provided with diffuse surfaces facing the respective photovoltaic plates.

The collectors may have a mushroom shape upon which arrays of lenses are provided and the mushroom-shaped collectors may themselves be stackable by having the stem of one collector fit into the convex body of another. Hexagonal convex lenses in the shape of a honeycomb make an efficient collection system.

I have found, moreover, that the principle of utilizing a stack of photovoltaic members so as to provide them in a compact configuration and eliminate the need for spreading the photovoltaic surface area over large areas of a home owner's property or elsewhere, can be embodied in systems which do not require the aforementioned tower to collect the solar radiation. In that case, the stack can be provided, for example, at the focus of a reflective element or directly beneath a lens system or other solar energy collector system with the photovoltaic panel being on edge and having the solar energy distributed to the photovoltaic surfaces by optical conductors. In that case the optical conductors may alternate with the photovoltaic members and can receive the solar energy directly from the collecting lens or reflector system, or can communicate via optical fibers, light-conducting rods and the like with a remote optical collector.

The distribution of light within the stack to the photovoltaic surfaces can be effected in a variety of ways including, for example, the system described in U.S. Pat. No. 5,222,795. For instance, I may provide light-conductive panels of polyacrylate (e.g. Lucite), with a surface confronting the photovoltaic panel which has been abraded or roughened for outputting the light supplied to the light-conductive sheet or plate over the entire surface or over the zones. Alternatively, I may distribute the light via fibers capable of emitting light over their respective lengths, or by forming light-emitting tracks On a light-conductive plate, or by providing the plate so that it is wedge-shaped. It has been found to be advantageous, in general, to taper the photo-conductive members which alternate with the photovoltaic surfaces.

I have found, further, that it is of advantage to cool the photovoltaic members or the photo-conductive members or both and for this purpose, spaces can be provided within the stack through which a cooling fluid, e.g. circulated air or cooling liquid, can be passed. In this sense, the liquid is heated by a photothermal action and I can utilize that heated fluid for heating purposes or for the heating of drinking, cooking or bathing water, i.e. utility water, in the home.

According to another aspect of the invention, a photocollector delivers solar energy to a photocollector which can have a sunburst array of conductors immersed in water or another liquid in a photothermal system for providing heat in the structure by conversion of solar energy to optical energy and the optical energy into thermal energy. In that case, the strands of the light conductor can be provided with sheaths of metal and blackened for maximum radiation transmission to the body of water surrounding it. Hexagonal photothermal rods avoid interstitial losses.

According to another feature of the invention, the stack is formed in a telescoping arrangement of members which can be extended for use in collecting solar energy or can be contracted for storage. This provides an especially space-saving arrangement of the stack which nevertheless ensures a large area availability for the surfaces of the stack to be exposed to the solar energy, e.g. through a lens system or some other delivery means.

BRIEF DESCRIPTION OF THE DRAWING

The above and other objects, features, and advantages will become more readily apparent from the following description, reference being made to the accompanying drawing in which:

FIG. 5 is an elevational view partly broken away of a mushroom-shaped collector according to the invention;

FIG. 6 is an elevational view partly in section showing stacking of mushroom-shaped collectors;

FIG. 7 is a detail view, partly broken away, of a stack system according to another embodiment of the invention;

FIG. 8 is a view similar to FIG. 7 of still another stack arrangement;

FIG. 15 is a perspective view showing another light distribution system utilizing the principles of the present invention;

FIG. 16 is a perspective view diagrammatically illustrating a telescoping stack according to the invention in its extended position;

FIG. 17 is a perspective view of this stack in its contracted position;

SPECIFIC DESCRIPTION

Figure 1:
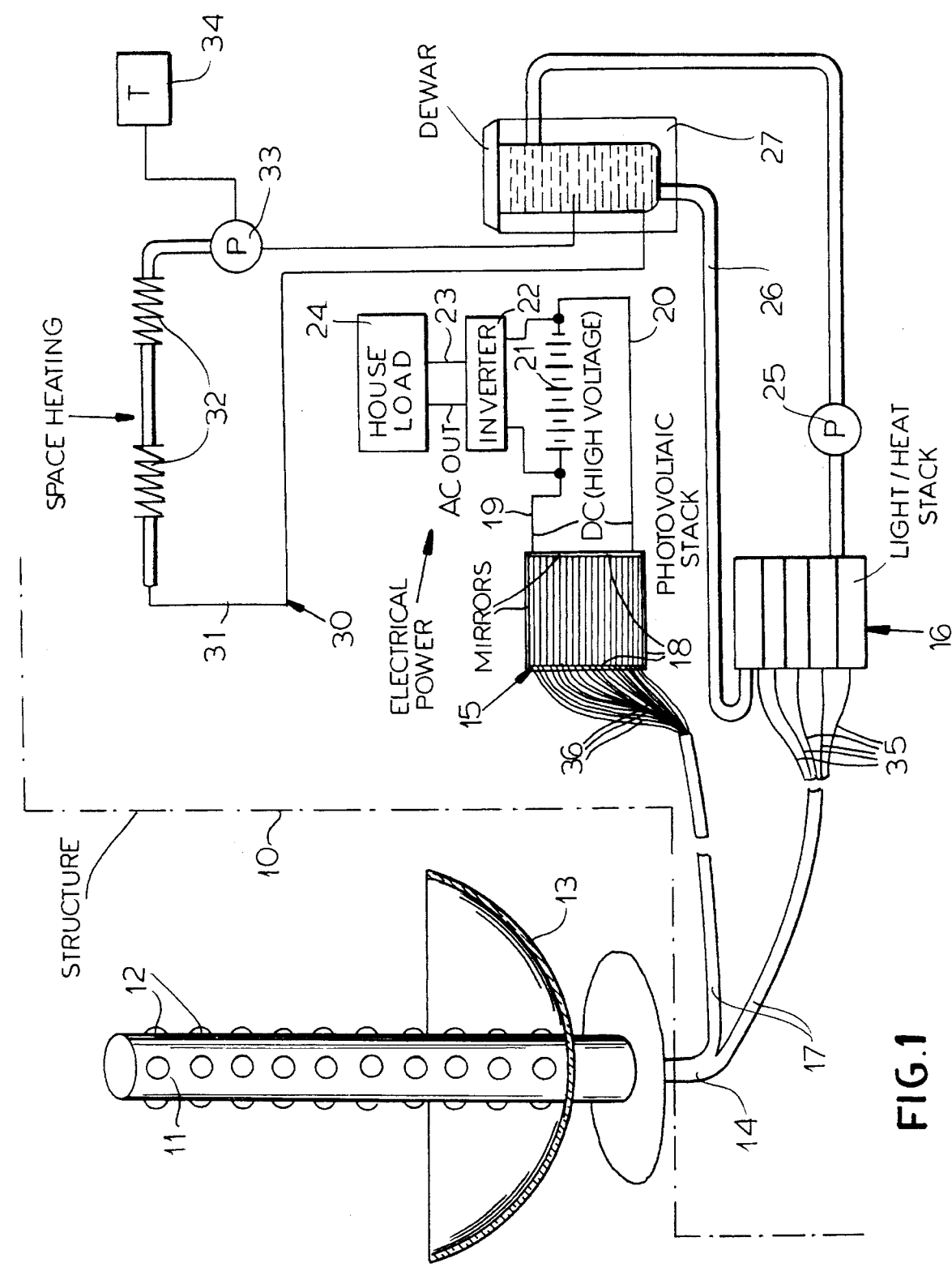
FIG. 1 is a diagram, partly in section, showing the principles of a fiber optic power-generating system according to the invention.

As will be apparent from FIG. 1, the delivery of energy to a structure 10, e.g. a residence such as a single or multi-family home, can utilize a tower 11 provided with an array of collecting elements 12, here shown to be collecting lenses, peripherally and over the height of the tower. While the tower has been shown as a simple cylindrical column in the drawing for illustrative purposes only, it will be understood that it may have any other convenient configuration occupying as little space as possible and may be as tall as is necessary to collect the requisite amount of energy to Service the facility. Of course, the tower should be located outside the structure and out of the shadow thereof and may, if desired, be located atop the structure, alongside it or even remote from the structure if advantageous.

If desired, the tower may be provided with one or more reflectors, as represented by the parabolic reflector 13 to reflect solar energy onto the collectors. The reflectors need not be part of the tower.

From the tower, an optical fiber trunk 14 runs to the structure 10 and may be a single large diameter optical fiber or a bundle of optical fibers.

The optical fiber trunk can deliver energy to an electrical-generating stack 15 or to a heat-generating stack 16 or, where the optical fiber trunk is split at 17, to both the electricity-generating stack and the heat-generating stack. The division of the optical fiber trunk at 17 may be in proportion to the amount of electrical and thermal energy required.

The stack 15 comprises a stack of photovoltaic plates alternating with light-distributing plates as will be described in greater detail hereinafter ! and can be surrounded by mirrors 18 so as to minimize light losses from the stack. The photovoltaic plates of the stack 15 may be connected in series so that a high voltage is outputted from the stack at the DC terminals 19 and 20 across which a battery 21 is connected as an energy-storage source.

Since household current is normally alternating current, an inverter 22 is connected across the battery to output at 23 the alternating current to the household load 24, namely, the outlets, lights and other electrically driven household equipment and appliances.

The photothermal stack 16 converts light to heat and the heat is abstracted by circulating a liquid through the stack 16 via a pump 25. The heat-abstracting liquid circulation is represented at 26 and can include a Dewar vessel 27 which, because of the vacuum insulation characteristic of a Dewar vessel, has low thermal loss. The heat abstracting liquid may be water. As represented at 30, a space-heating loop 31 with space-heating converters 32 may be connected to the liquid-storage vessel 27 and provided with a pump 33 for the heating of the structure. A thermostat 34 can control the pump 33. The space-heating unit 30 represents utilization in the structure 10 of the thermal energy obtained from the light supplied by the optical fibers 35 of the portion of the trunk 14 supplying the stack 16. Of course other applications, such as feeding the light to seedling-filled drawers for agricultural purposes is also within the scope of this invention. The optical fibers 36 of the other portion of the trunk, of course, are connected to light distributors of the photovoltaic stack.

From FIG. 1 it will be immediately apparent that a large overall photovoltaic area can be utilized in a small volume and without covering large areas of the property with solar collectors.

Figure 2:
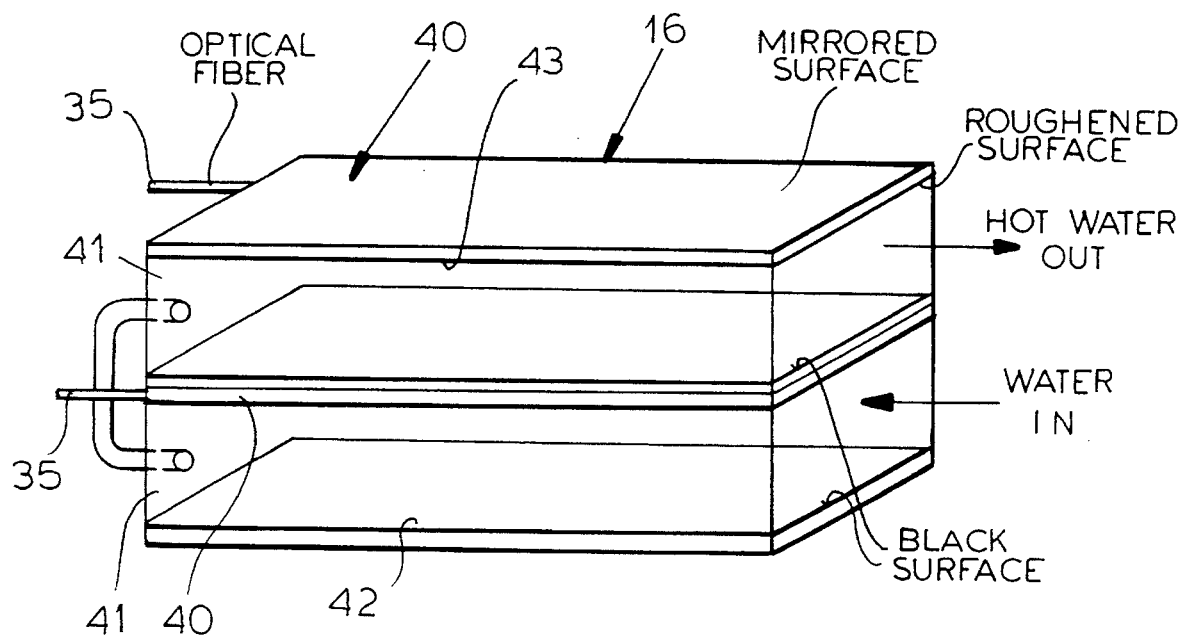
FIG. 2 is a diagrammatic perspective view showing a detail of the heat-generating unit of that system.
Figure 4:
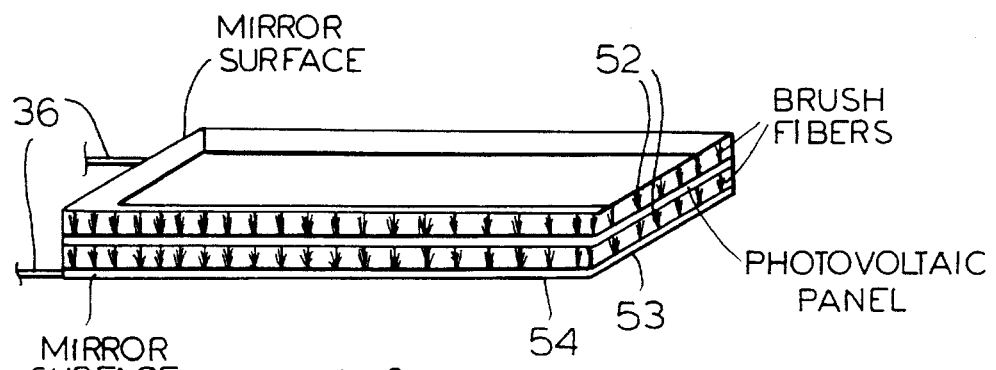
FIG. 4 is a perspective view showing the use of brush plates as light distributors according to the invention.

In FIG. 2 I have shown a portion of the light/heat transducing stack 16. This stack is shown to consist of light distributors 40 which cooperate with chambers 41 traversed by the water to be heated. Each of the chambers 41 has a blackened heat-absorbing surface 42 upon which the light impinges and which raises in a temperature as a function of the amount of light energy supplied. The distributors 40 are supplied with light by the optical fibers 35 and have roughened or diffuse surfaces 43 at which light is emitted and reflective surfaces or mirrored surfaces. 44 directing the light toward the respective chamber. Brush-like distributors as will be described in connection with FIG. 4 may also be used.

It will be appreciated that water circulated through the stack will be heated by the thermal energy produced from the distributed light supplied by the optical fibers 35.

Figure 3:
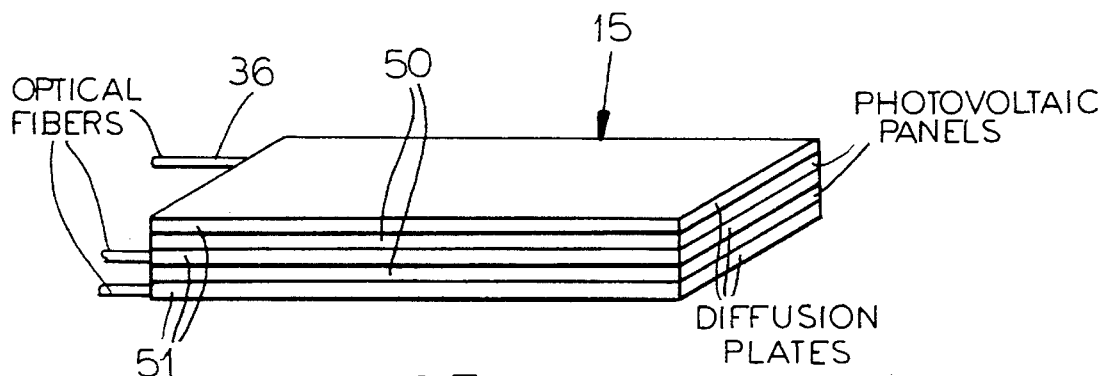
FIG. 3 is a detail of the photovoltaic stack according to one embodiment of the invention.

As can be seen from FIG. 3, where a portion of the stack 15 is shown, photovoltaic panels 50 sandwich light diffusion plates 51 between them and, in turn, are sandwiched between light diffusion plates which may have the same construction as the distributors 40 of FIG. 2 but are here supplied by the optical fibers 36.

Optical distributors in the form of brushes 52 of optical fibers connected to a light-transmitting support 53 and provided with a mirror surface 54 opposite the brush fiber can alternatively be supplied by the optical fibers 36 to distribute a light over the areas of the optical fiber. In either case, the photovoltaic plates receive the optical energy from light distributors over their entire areas and generate electrical energy in the manner described.

Instead of lenses 12 at the tower 11, the collectors may be formed as mushroom-shaped elements 60 which have generally spherical convex body portions 61 on which collecting lenses 62 are mounted, these lenses being focused on the ends of optical fibers 63 running to a trunk 64 in the form of an optical fiber bundle or a fiber optical rod 65 to which the optical fiber bundle 64 is connected. The stem 66 of the mushroom-shaped element can be mounted directly in the tower or the stem of one mushroom-shaped collector 70 can be threaded into the body 71 of another to create a stack 72 of the mushroom-shaped collectors here shown on a plate 73 forming part of a tower and which can be provided with a multiplicity of such stacks in spaced-apart relationship. Optical fiber trunk or bundle 74 from each stack may run together with other bundles or fibers to form still a larger trunk which can enter the structure.

FIG. 7 illustrates a principle of the invention which has been referred to only generally previously and that is that the light conductor and the semiconductive photovoltaic elements may have a taper for greater efficiency. In the embodiment of FIG. 7, the stack 75 is made up of a horizontal array of spaced-apart light conductive cones 76 in respective horizontal layers disposed one above another to provide a three-dimensional array with interstices 77 which can be filled with a cooling liquid circulated through the interstices by a pump 78 of a cooling water circulation system.

In this embodiment, the photovoltaic elements are formed directly upon the light-conducting cones 76. To this end, the surface 76a of each cones may be roughened, e.g. by sandblasting, and receives the semiconductor layer 76b which forms the photovoltaic layer and is provided, in turn, with an outer metallic film 76c electrically connected as shown by the conductor 76d, to the electrical output network of the power supply system. Here, therefore, the photovoltaic elements are formed on the light-conductive elements. The light collected from the solar rays are communicated to the conical rods 76 by optical conductors 79 which may be optical fibers, polyacrylate rods or the like.

The optical energy which is not converted to electricity in the system is converted to heat and is used to warm the water circulated through the spaces 77 and thus the unit shown in FIG. 7 also functions as a photothermal heating source for space heating in the structure or for the heating of utility water, i.e. drinking or shower water. To improve the heat exchange between the metal film 76c and the water, the metal film may be roughened and may be blackened, e.g. by anodization.

In FIG. 8 I have shown another principle of the invention in which, from a large-diameter optical conductor or rod 80, a multiplicity of wedge-shaped flat fingers 81 extend as respective light conductors, alternating with photovoltaic elements 82. Mirrors may be provided at 83, for example, and wherever there may be losses from the stack 85 formed by the alternating light 81 and photovoltaic elements 82. The system of FIG. 8 operates in the manner which has been described. Water coolant may circulate and the warm water thus produced may be used for domestic applications.

Figure 9:
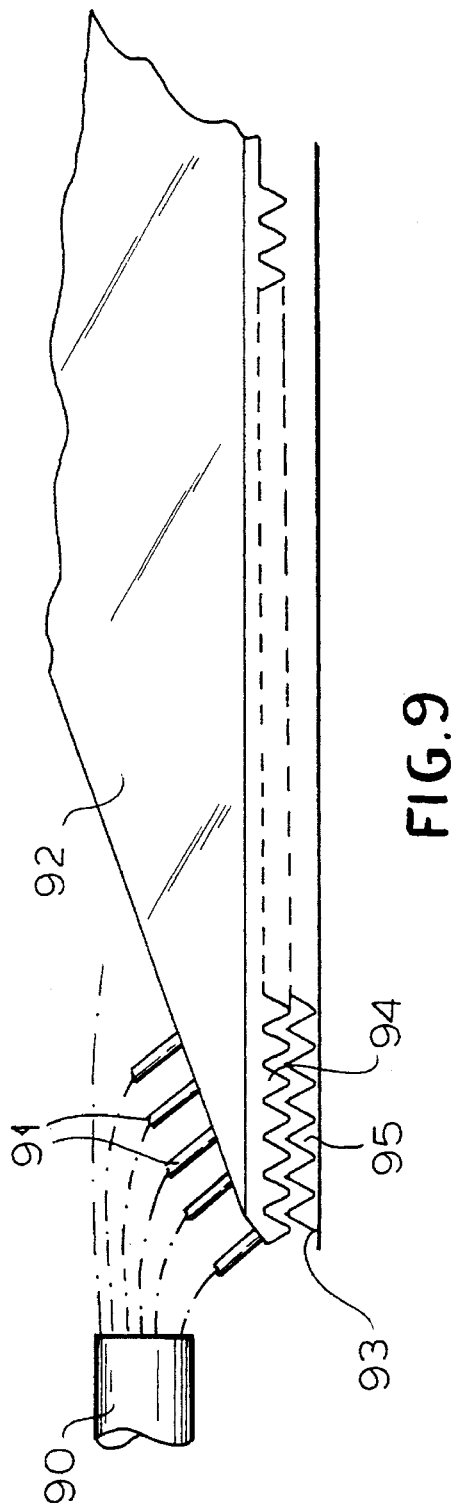
FIG. 9 is a fragmentary perspective view illustrating another principle of the invention.

As will be apparent from FIG. 9, a light-conductive member or rod 90 may terminate in a multiplicity of optical fibers 91 which, in turn, end in a light-conductive plate 92, e.g. of an acrylic synthetic resin. To increase the area of interface between this plate and the underlying photovoltaic plate 93 of the stack, the light-distributing plate 92 and the photovoltaic plate 93 may have interfitting ribs or ridges 94 and 95. Such plates can be stacked in any number alternately with one another.

Figure 10:
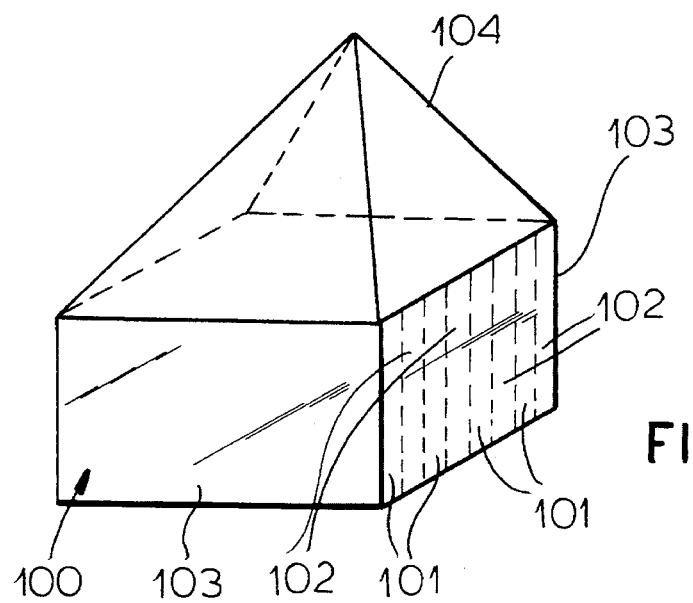
FIG. 10 is a perspective view of a high-performance stack receiving solar energy through a prism in accordance with another feature of the invention.

In FIG. 10, for example, I show a stack 100 of alternating light-distributing plates 101 and photovoltaic plates 102 which are disposed on edge and can be peripherally surrounded by mirrors 103 except for the upper light receiving surface which is covered by a prism 104 conducting solar energy to the stack 100. A pyramidal shell of Fresnel lenses could serve a similar function and be much lighter weight.

Since the solar energy is imparted to exposed edges of the light-conductive plates 101 and is then distributed over the areas of these plates to the photovoltaic plates between the light-conductive plates, the areas of the photovoltaic plates receiving the light can be far greater than the area of the upper surface of the stack 100. In practice, it has been found that a photovoltaic layer directly exposed to the sun or to a magnifier or solar energy concentrator, has a limiting power absorption. That limitation in the power absorbed per unit area plays no role in the system of the invention since the light power received over the area of the stack is distributed over many times that area of the photovoltaic layers by the photo-conductive layers interleaved therewith.

Figure 11:
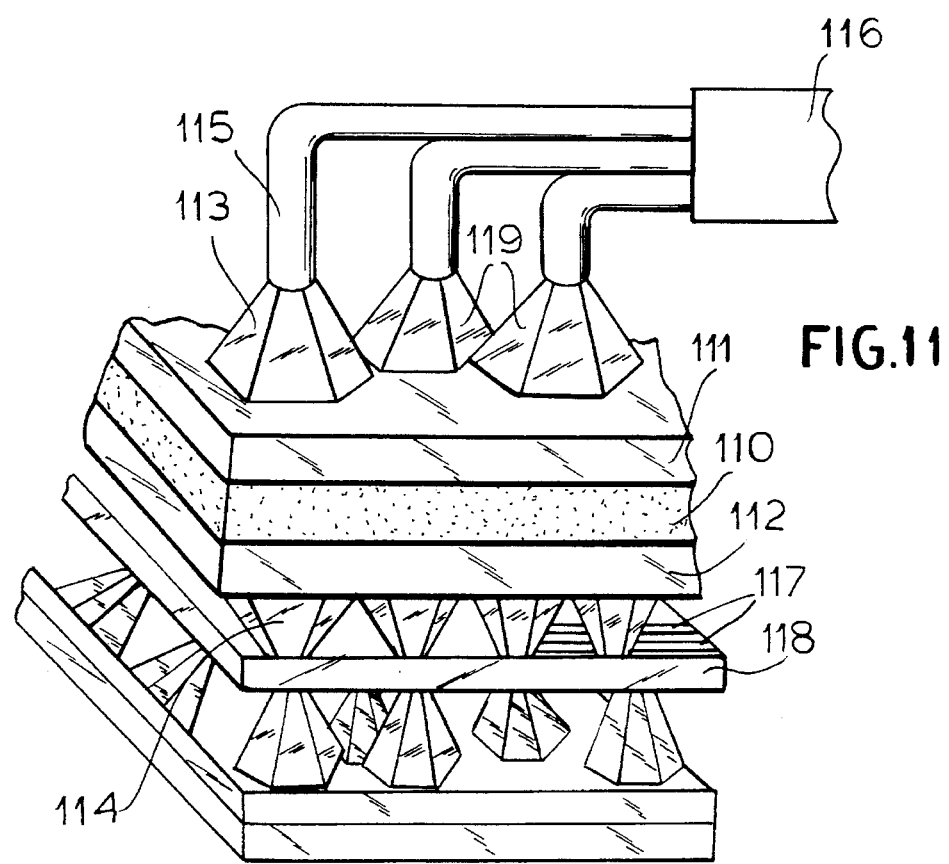
FIG. 11 is a perspective view of a portion of a stack illustrating still other principles of the invention.

FIG. 11 shows another system for distributing light to the photovoltaic layers. For example, the photovoltaic layer 110 is disposed between two photo-conductive plates 111 and 112, each of which is formed with a surface array of pyramids 113 and 114 which are truncated and have bases corresponding to hexagons in a close-packed relationship. The light can be delivered to these pyramids in various ways. For example, in the upper portion of FIG. 11, each pyramid 113 is shown to be at the terminus of a respective optical fiber 115 deriving from the trunk 116 which can be connected to a tower or other solar-collector system as has been described heretofore.

The pyramids 114, however, receive light from optical waveguides 117 formed on a plate 118 and connected, in turn, to the solar-energy collector by an optical conductor system. These waveguides may be individual to the respective pyramids 114 or can connect to a row of such pyramids as may be desired. The pyramids 113 and 114 may be provided with reflective surfaces as shown at 119 at the upper portion of FIG. 11 and reflectors or mirrors can be provided all around the stack shown in FIG. 11 to limit optical losses.

Figure 12:
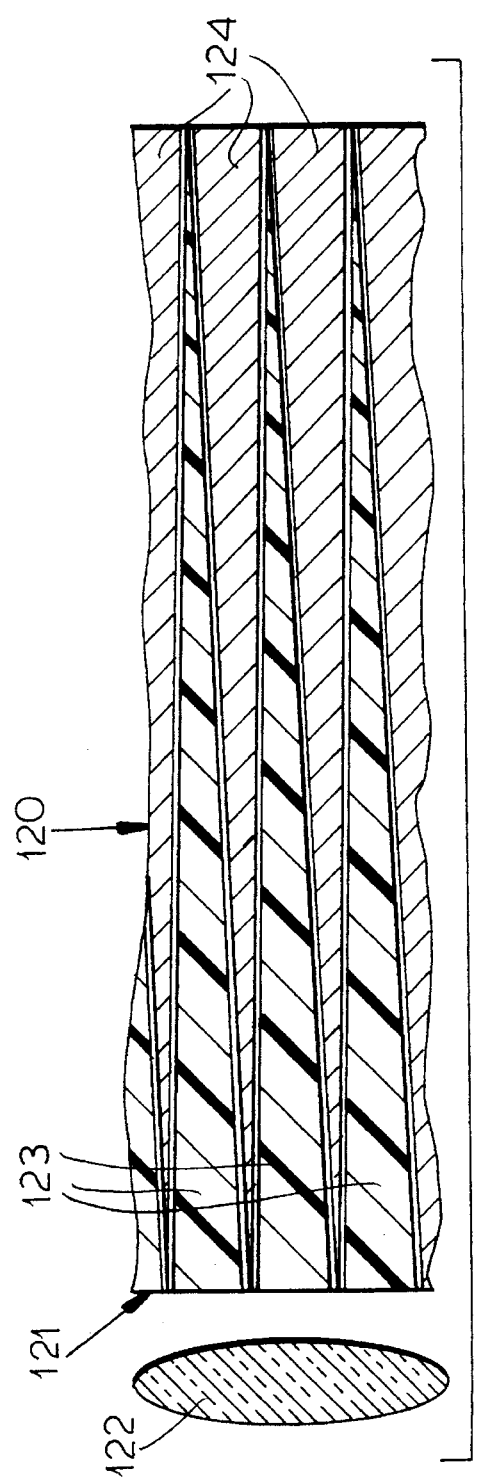
FIG. 12 is a partial section through a stack according to the invention.

FIG. 12 shows another principle of the invention in which the stack 120 can have a surface 121 which is exposed to solar energy directly, i.e. without an optical-conductor system, e.g. through a lens 122 or some similar solar energy-collector arrangement. That arrangement can be a reflector, a Fresnel lens arrangement or the like. Here the stack 120 is shown to consist of alternating layers 123 and 124 of light-conductive wedges and photovoltaic semiconductor wedges generating electricity when receiving light from the wedges 123.

Figure 13:
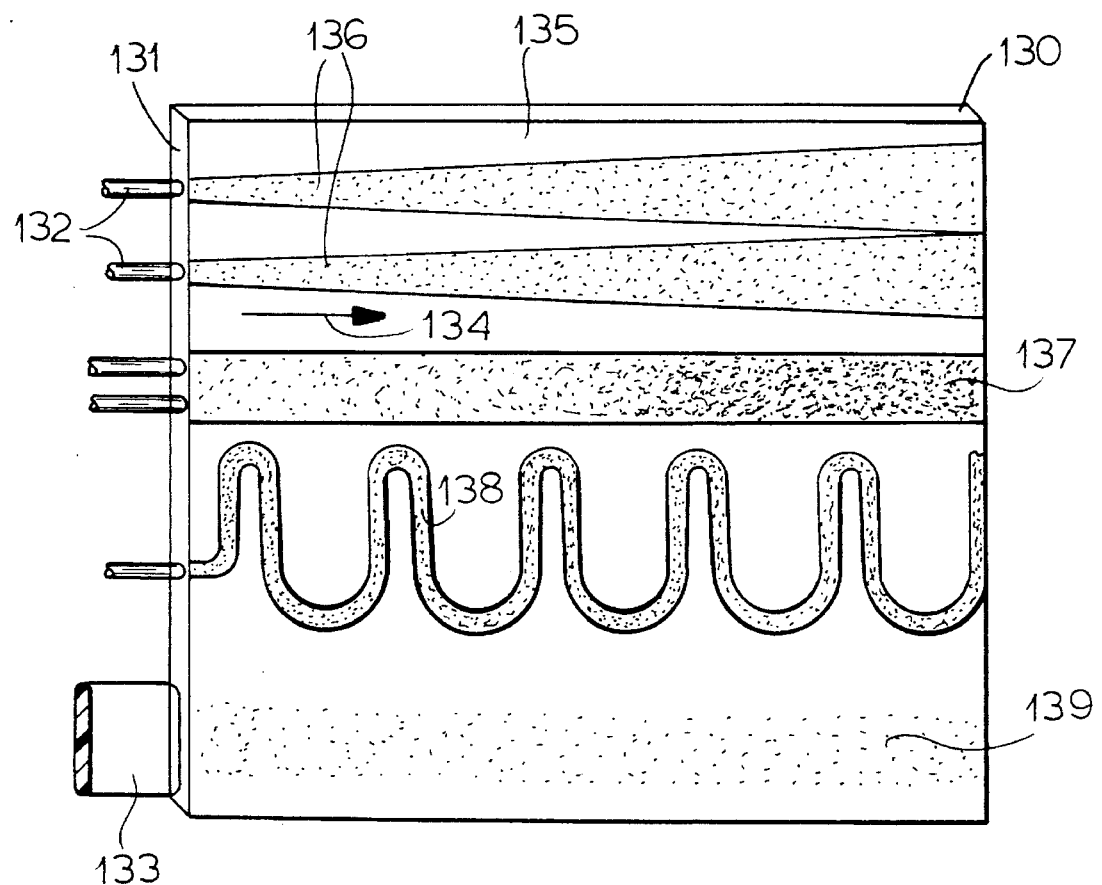
FIG. 13 is a view of a surface of a light-conductive plate showing various means for emitting light to the photovoltaic layer in contact with this surface but not shown, in another stack according to the invention.

Turning to FIG. 13, in which I have shown a light-conductive plate 130 adapted to be juxtaposed with a photovoltaic plate to distribute light thereto, it can be seen that the plate 130 has an edge 131 which can be considered the input edge and which is exposed to light from a solar-collecting system which can include optical fibers 132 or optical conductor rods 133, or simply exposed surfaces upon which light is trained by a lens system, a reflector or some other means. The light is conducted through the plate 130 generally in the direction represented by the arrow 134 and is emitted at the broad surface 135 juxtaposed with the photovoltaic layer by reason of the treatment of this surface. For example, the surface 135 can have sandblasted wedge-shaped patterns 136 along which the light is emitted, the surface roughening resulting in a diffuse light output which can be uniform the length of the wedge-shaped pattern 136 by reason of an increasing area away from the source of that light, namely, the edge 131, the light intensity within the plate 135 falling off with distance from the edge 131.

In FIG. 13, I have shown a band 137 at which the sandblasting intensity increases from left to right so that the surface roughening effect increases progressively across the width of the plate 135 in the direction in which the light travels and in which the light intensity falls off in the manner described. Any other surface roughening pattern can be adopted as desired and I show at 138 a meandering or serpentine pattern by way of example. A general surface roughening is represented at 139 to promote emission of light in the region at which the light affecting bar 133 connects with the plate 135.

It has been pointed out that, in one mode of operation of the power-generating system of the invention, between the solar energy collector, e.g. a tower and the stack, the light-conductor system is provided, which is connected to the light distributors alternating with the photovoltaic elements of the stack.

Figure 14:
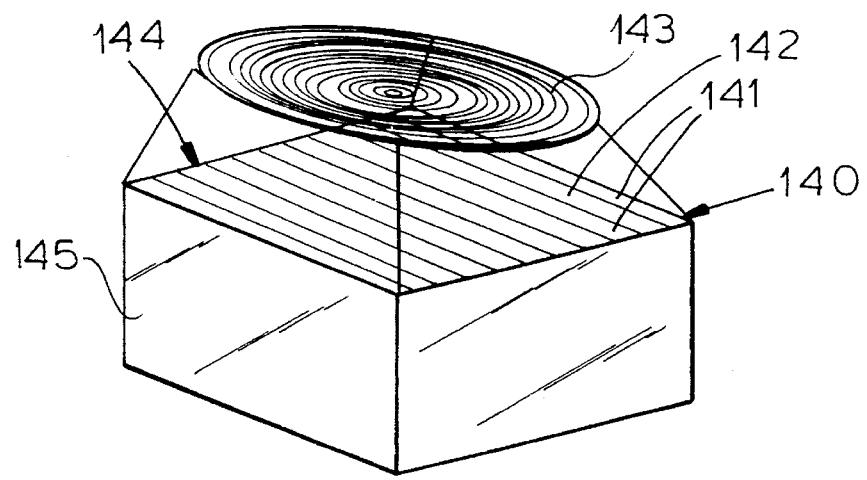
FIG. 14 is a perspective view illustrating still another principle of the invention.

In FIG. 14, the stack 140, made up of the alternating light-conductive elements 141 and photovoltaic elements 142 is exposed to solar energy amplified by a Fresnel lens 143 positioned above the horizontal receiving surface 144 of this stack. Here the edges of the light-conductive elements 141 collect the solar energy without intervening light-conductive fibers and distribute that energy to the photovoltaic plates in the manner previously described. All other surfaces of the stack may be mirrored, as shown, for example, at 145.

FIG. 15 illustrates another layer system for distributing light to the photovoltaic plates 151 in a stack of which only a single photovoltaic plate and two arrays of distributing filaments have been shown.

The upper array of distributing filaments 152 and the lower array of distributing filaments 153 can correspond to the two optical conductor plates between which each photovoltaic element of a stack is sandwiched. The filaments of the arrays 152 and 153 can be built into a plate or layer or can be simply mounted on the photovoltaic plate. They may consist of filaments 154 of different lengths and of semicircular cross section, roughened on their sides in contact with the photovoltaic plate to promote the emission of light from these longitudinal sides. The solar energy is delivered to these filaments by connecting filaments 155 receiving the solar energy from collecting lenses, reflectors or the like in a tower or from some other collecting array.

In FIGS. 16 and 17 I have shown a stack of alternating photovoltaic layers 161 and optically conductive layers 162 and 163 which are exposed to solar energy on edge in the direction of the arrows 164 when the stacks 165 and 166 are telescopingly extended from the stack 167 shown in its compact or contracted form in FIG. 17. This allows a stack to be stored in a small space and, when it is to be used for exposure to a lens system, a reflector or the like, to be drawn out the full length (16) is positioned to intercept the solar rays.

Figure 18:
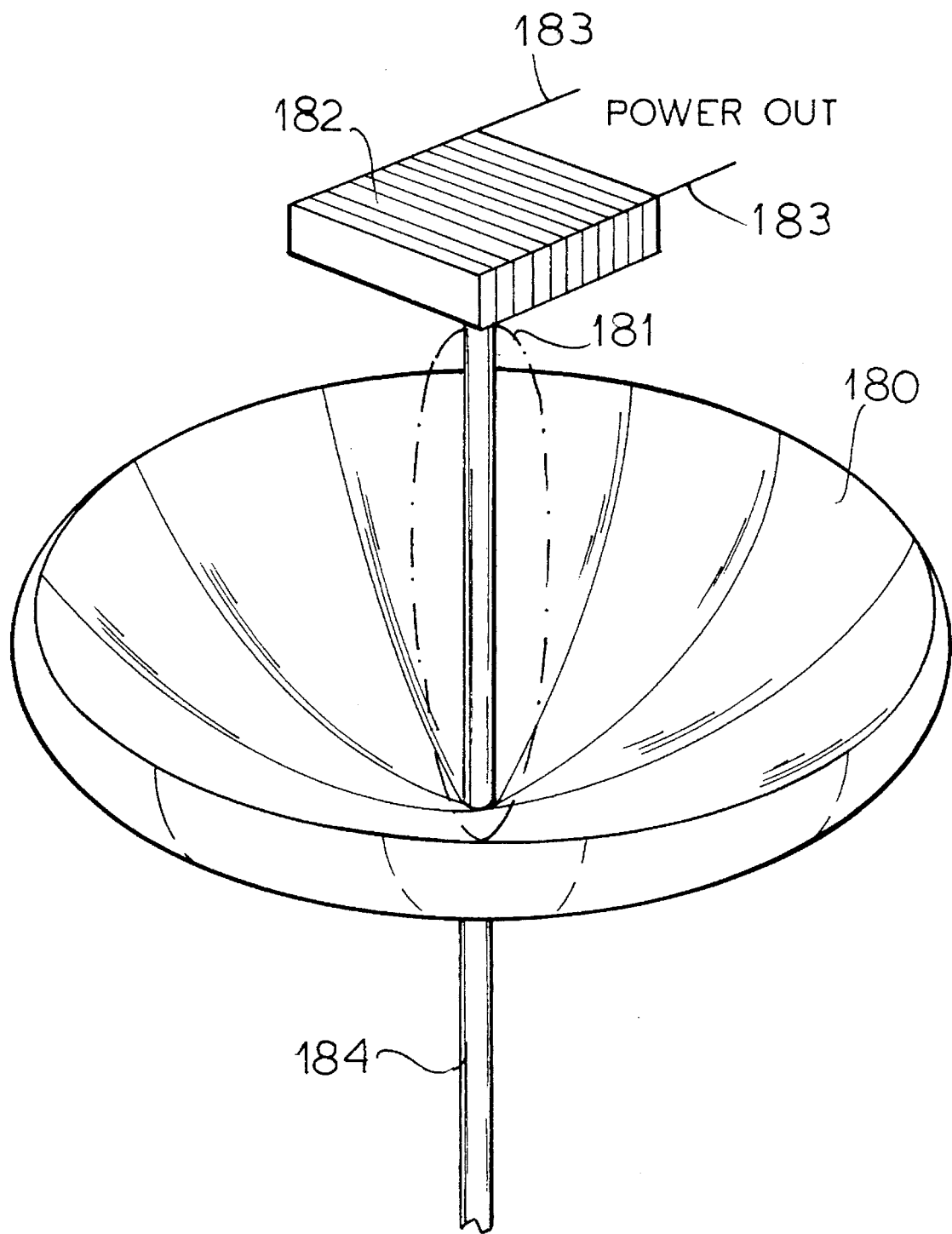
FIG. 18 shows another embodiment of the invention in perspective view.

FIG. 18 shows an embodiment of the invention in which a reflector 180 is capable of being folded out like an inverted umbrella (solid lines) or folded up into a closed position as shown at 181 in dot-dash lines. The reflector 180 directs solar energy against the stack 182 which can have the configuration shown in FIG. 10 or FIG. 12, the solar energy being supplied to the light-distributing plates of the stack on edge. The electrical power output leads are shown at 183 and the assembly can be mounted on a post 184 inserted in the ground. The leads 183 may be conducted through the post if desired.

Figure 19:
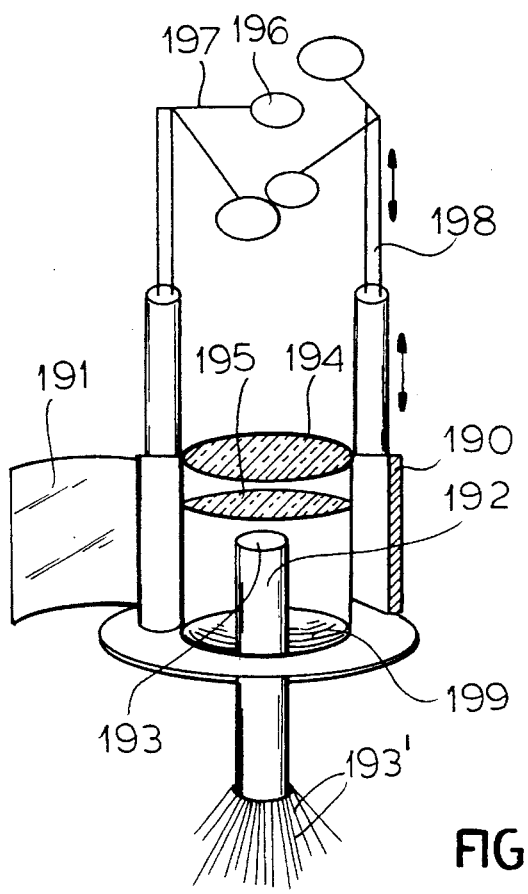
FIG. 19 is a diagram illustrating another tower for collecting light according to the invention.

In FIG. 19, the principles of solar energy collection have been shown in a more compact arrangement in which a housing (reflective) 190 has an access door 191 to allow maintenance and which is shown to be swung open in FIGS. 19, and receives a light conductor 192 terminating in optical fibers 193 connected to a stack or running to a thermal energy reservoir as will be described in connection with FIGS. 20 and 21. The solar energy is delivered to a lens 193 at the end of the light conductor 192 through lenses 194 and 195 while additional lenses 196 on arms 197 can be adjusted to maximize delivery of light to the optical conductor 192. The arms 197 can be raised and lowered on telescoping rods 198 and the door 191, located at the south side of the solar collector can be transparent if desired. A reflector 199 can be provided at the base of the housing 190.

Figure 20:
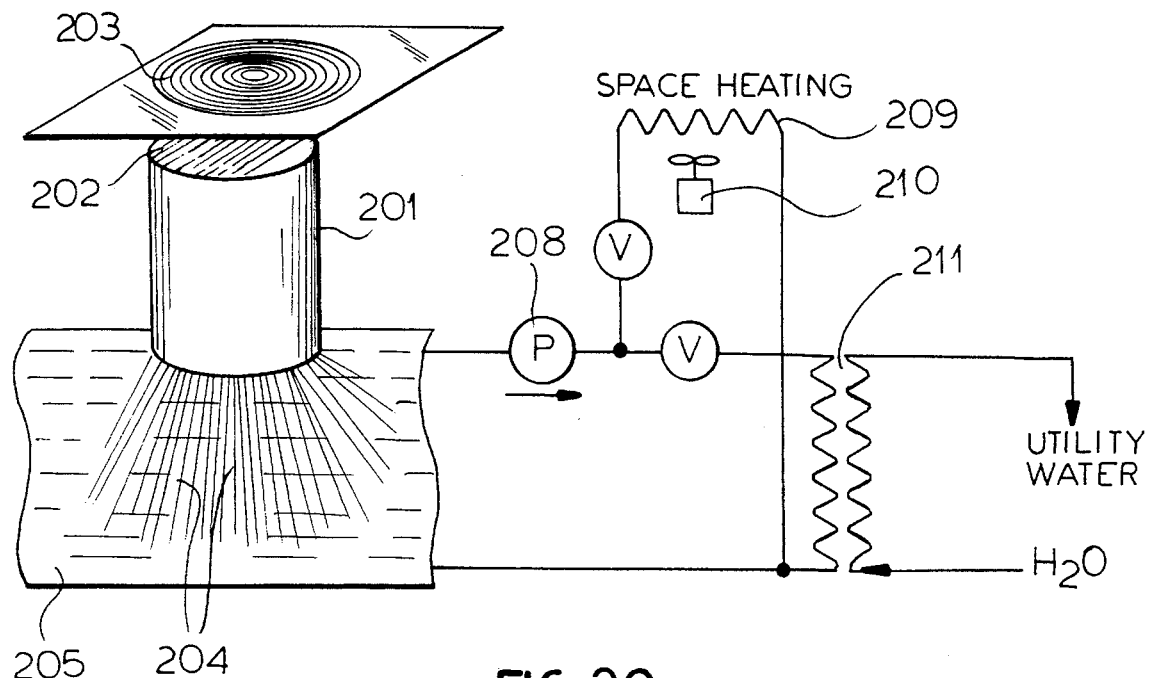
FIG. 20 is a diagram of a heating system utilizing principles of the invention.

In FIG. 20, I have shown the principles of the invention as applied to a photothermal system. Here the optical conductor 201 is provided with an end 202 upon which solar energy is concentrated, e.g. by a Fresnel lens system 203. The optical conductor 201 terminates in optical fibers 204 in a sunburst array, immersed in a body of liquid 205, usually water.

Figure 21:
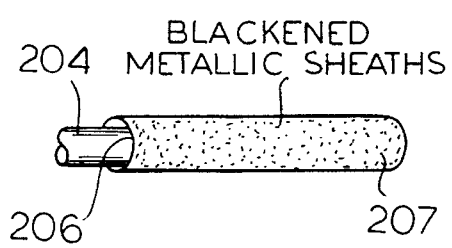
FIG. 21 is a perspective view of a light conductive filament provided with a blackened metallic sheath for use in that heating system.

As can be seen from FIG. 21, the fibers 204 are jacketed in metallic sheaths 206 with blackened external surfaces 207 to maximize the conversion of optical energy to heat which raises the temperature of the water. The water can be circulated by the pump 208 to space-heating units 209 with direct current fans 210 which can be powered by the electricity produced by the power-generating system of FIG. 1. Through a heat exchanger 211, the heated water 205 can be Utilized to provide utility water to the home, i.e. sink and bathroom hot water.

The solar energy in this embodiment is converted directly to heat raising the temperature of the water 205 in which the sunburst array of fibers 204 are immersed.

I claim:

1. A power-generating assembly comprising a stack of alternating photovoltaic members and light-distributing members positioned to distribute light over surface areas of said photovoltaic members, and means for tapping electricity from said photovoltaic members, said stack having at least one side at which edges of said light-distributing members receive solar energy for distribution to said photovoiltaic members, said stack being collapsible into a compact configuration and expandable into an extended configuration.

2. A power-generating assembly comprising a stack of alternating photovoltaic members and light-distributing members positioned to distribute light over surface areas of said photovoltaic members, means for delivering light to said light distributing members, and means for tapping electricity from said photovoltaic members, said light-distributing members tapering from one side of said stack toward an opposite side thereof and said photovoltaic members tapering from said opposite side toward said one side complementarily to said light-distributing members, said means for delivering light including a source of light directed onto said light-distributing members at said one side.

3. The assembly defined in claim 2 wherein said means for delivering light includes a lens focussed on said light-distributing members.

4. The assembly defined in claim 2 wherein said means for delivering light includes at least one light conductor coupled to said light-distributing members.

5. A power-generating assembly comprising a stack of alternating photovoltaic members and light-distributing members positioned to distribute light over surface areas of said photovoltaic members, means for delivering light to said light-distributing members, and means for tapping electricity from said photovoltaic members, said means for delivering light including at least one prism-shaped multifaceted light-conducting member diverging toward a side of said stack.

6. The assembly defined in claim 5 wherein said means for delivering light comprises a multiplicity of prism-shaped multifaceted light-conducting members distributed over said side of said stack and diverging toward said side of said stack, and a respective light conductor optically coupled to each of said prism-shaped multifaceted light-conducting members.

7. A power-generating assembly comprising a stack of alternating photovoltaic members and light-distributing members positioned to distribute light over surface areas of said photovoltaic members, means for delivering light to said light-distributing members, and means for tapping electricity from said photovoltaic members, said light-distributing members being flat light-conductive plates formed at least along one broad surface of each plate with a succession of triangular-section ridges separated by triangular-section grooves interfitting with an adjacent surface of a respective photovoltaic member, said means for delivering light to said light-distributing members including light conductor means coupled to edges of said plates along at least one side of said stack.

8. A power-generating assembly comprising a stack of alternating photovoltaic members and light-distributing members positioned to distribute light over surface areas of said photovoltaic members, means for delivering light to said light-distributing members, and means for tapping electricity from said photovoltaic members, at least one of said light-distributing members comprising an array of mutually parallel rods extending from one side of said stack toward an opposite side thereof in at least one layer, said means for delivering light to said light-distributing members including at least one light conductor coupled to ends of the respective rods at said one side of said stack further comprising cooling means for flowing a cooling fluid around said rods.

9. The assembly defined in claim 8 wherein said rods taper from said one side to Said opposite side.

10. A power-generating assembly comprising a stack of alternating photovoltaic members and light-distributing members positioned to distribute light over surface areas of said photovoltaic members, means For delivering light to said light-distributing members, and means for tapping electricity from said photovoltaic members, at least one of said light-distributing members being a light-conductive plate having an array of prism-shaped multifaceted projections thereon tapering away from the plate.

\* \* \* \* \*